US008891565B2

(12) United States Patent
Kakui

(10) Patent No.: US 8,891,565 B2
(45) Date of Patent: *Nov. 18, 2014

(54) PULSE LIGHT SOURCE

(71) Applicant: Megaopto Co., Ltd., Wako (JP)

(72) Inventor: Motoki Kakui, Yokohama (JP)

(73) Assignee: Megaopto Co., Ltd., Wako-shi (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/065,146

(22) Filed: Oct. 28, 2013

(65) Prior Publication Data

US 2014/0050238 A1 Feb. 20, 2014

Related U.S. Application Data

(63) Continuation of application No. 13/604,127, filed on Sep. 5, 2012, now Pat. No. 8,599,888, which is a continuation of application No. 12/277,897, filed on Nov. 25, 2008, now Pat. No. 8,290,003.

(30) Foreign Application Priority Data

Nov. 30, 2007 (JP) ................. 2007-311022
Oct. 31, 2008 (JP) ................. 2008-281820

(51) Int. Cl.
*H01S 3/10* (2006.01)
*H01S 5/062* (2006.01)
*H01S 5/0683* (2006.01)
*H01S 5/024* (2006.01)
*H01S 3/23* (2006.01)
*H01S 5/06* (2006.01)
*H01S 3/067* (2006.01)
*H01S 3/16* (2006.01)

(52) U.S. Cl.
CPC .......... *H01S 5/0683* (2013.01); *H01S 5/06216* (2013.01); *H01S 3/06754* (2013.01); *H01S 5/024* (2013.01); *H01S 3/1618* (2013.01); *H01S 3/2308* (2013.01); *H01S 5/0612* (2013.01)
USPC ................................................. 372/25; 372/6

(58) Field of Classification Search
USPC ...................................................... 372/6, 25
See application file for complete search history.

(56) References Cited

U.S. PATENT DOCUMENTS 5,943,349 A 8/1999 Ohta
7,538,936 B2 5/2009 Yokoyama (Continued)

FOREIGN PATENT DOCUMENTS

JP 2007-532005 A 11/2007
JP 5355991 B2 11/2013
WO WO-2006/003969 A1 1/2006

OTHER PUBLICATIONS

"Generation and Control of Ultrashort Light Pulse", Maruzen Co., Ltd., pp. 17-31, Mar. 15, 1990.

(Continued)

*Primary Examiner* — Yuanda Zhang
(74) *Attorney, Agent, or Firm* — Venable LLP; Michael A. Sartori; Tamatane J. Aga

(57) ABSTRACT

The pulse light source comprises a semiconductor laser outputting pulse light, an optical filter, and an optical amplifier. The optical filter outputs a chirping component of the inputted pulse light, by adjusting a relative position of a transmission spectrum of the optical filter with respect to an output spectrum of the seed light source.

18 Claims, 14 Drawing Sheets

(56) References Cited

U.S. PATENT DOCUMENTS

| | | |
|---|---|---|
| 8,023,537 B2 | 9/2011 | Inoue |
| 8,290,003 B2 | 10/2012 | Kakui |
| 8,599,888 B2 * | 12/2013 | Kakui ............................ 372/25 |
| 2001/0026565 A1 * | 10/2001 | Takeshita et al. .......... 372/38.02 |
| 2002/0041618 A1 | 4/2002 | Watanabe et al. |
| 2002/0044342 A1 | 4/2002 | Krummrich |
| 2003/0043451 A1 | 3/2003 | Kato et al. |
| 2004/0095635 A1 | 5/2004 | Kakui |
| 2006/0215713 A1 * | 9/2006 | Flanders et al. ................ 372/20 |
| 2006/0257150 A1 | 11/2006 | Tsuchiya et al. |
| 2007/0041083 A1 | 2/2007 | Di Teodoro et al. |
| 2007/0268570 A1 | 11/2007 | Kakui |
| 2010/0284431 A1 * | 11/2010 | Inoue ............................ 372/32 |

OTHER PUBLICATIONS

Motoki Kakui, et al., "2.5-Gbit/s Repeaterless Transmission Systems over Non-Dispersion-Shifted Fiber Using Directly Modulated DFB Laser and Dispersion Compensating Fiber", Optical Fiber Technology 1, pp. 312-317, 1995.

F.D. Teodoro et al., "High-power Pulsed Fiber Source at 1567 nm", PhotonicWest, 2005.

J. Limpert et al., "All Fiber Chirped-Pulse Amplification System Based on Compression in Air-Guiding Photonic Bandgap Fiber", Optics Express, vol. 11, No. 24, pp. 3332-3337, Dec. 1, 2003.

Notice of Reasons for Rejection in Japanese Patent Application No. 2008-281820, dated Jan. 29, 2013.

Office Action issued Japanese Patent Application No. 2013-162042 dated Jul. 15, 2014.

* cited by examiner

PULSE LIGHT SOURCE

CROSS-REFERENCE TO RELATED APPLICATION

This application is a Continuation of U.S. patent application Ser. No. 13/604,127, filed Sep. 5, 2012, which is a Continuation of U.S. patent application Ser. No. 12/277,897, filed Nov. 25, 2008, and which claims the benefit of Japanese Patent Application No. 2007-311022, filed Nov. 30, 2007, and Japanese Patent Application No. 2008-281820, filed Oct. 31, 2008, all of which are incorporated herein by reference in their entirety.

BACKGROUND OF THE INVENTION

1. Field of the Invention

The present invention relates to a pulse light source and a pulse compression method.

2. Related Background Art

A pulse light source is used for industrial applications represented by machining and the like, and has a trend that a higher power output and a shorter pulse width are desired. In particular, the pulse light source used in a laser beam machine for micro-machining is desired to have a higher peak value and also a narrower pulse width for reducing a heat effect to an object to be machined as much as possible.

A Q switch, a mode lock, or the like has been proposed as a structure for generating pulse light in a gas laser light source or a solid laser light source (see Non-patent document 1). Further, a gain switching method using a semiconductor laser also attracts attention as a simpler method. The gain switching is realized after all by direct modulation of the semiconductor laser, and thereby, a pulse repetition rate thereof is not restricted by a hard structure as in the mode lock and does not need an expensive component such as an acousto-optic switch, which consumes huge electric power, as in the Q switch.

However, the semiconductor laser has a low optical output power in general compared to conventional laser light sources such as the gas laser light source and the solid laser light source, and is used generally for communication or measurement. Therefore, the semiconductor laser has not been required to have a high pulse peak power (see Non-patent documents 1 and 2).

Non-patent document 1: Cho-kosoku hikari gijutsu (Ultra high speed light technology), 2nd part, published by Maruzen in Mar. 15, 1990.

Non-patent document 2: M Kakui, et al., Optical Fiber Technology, vol. 1, pp. 312-317, 1995.

Non-patent document 3: F. D. Teodoro, et al., PhotonicWest 2005.

Non-patent document 4: J. Limpert et al., Optics Express, vol. 11, p. 3332, 2003.

SUMMARY OF THE INVENTION

The present inventors have examined conventional pulse light sources, and as a result, have discovered the following problems. That is, recently, there is observed sometimes a case of using a pulse light source having a MOPA (Maser Oscillator Power Amplifier) structure, which combines a directly-modulated semiconductor laser and an optical amplifier (specifically, optical fiber amplifier), for an application requiring a high power of more than 1 kW such as laser light machining (see Non-patent document 3). In such a case, the semiconductor laser is desired to have a higher pulse peak of output light as much as possible for reducing a gain required to the optical fiber amplifier part. That is, amplitude of a modulation current is desired to be larger.

However, it is not easy to modulate a current of several hundred milliamperes, and a rise time and a fall time thereof are limited to be reduced to several nanoseconds at a minimum (see Non-patent document 3). Meanwhile, there is a demand for a pulse width of less than 1 ns depending on an application, and some cases require a pulse width of an order of a femtosecond, for example (see Non-patent document 4). However, for generating the femtosecond pulse light, it is necessary to use a special optical amplification technique such as CPA or the like, and, in addition, there is a problem that pulse energy thereof is small and throughput in the laser machining is low.

From the above problems, the inventors consider that it has been difficult for the current fiber laser technology to reduce the pulse width on the time axis using a simple method without increasing a width on the frequency axis.

The present invention has been developed to eliminate the problems described above. It is an object of the present invention to provide a pulse light source and a pulse compression method that can easily output pulse light with a sub-nanosecond pulse width, the pulse light source having the MOPA structure using, as a seed light source, a semiconductor laser modulated directly with a modulation amplitude of exceeding 200 mA.

A pulse light source according to the present invention comprises a semiconductor laser, a first optical filter, and an optical amplifier. The semiconductor laser is a laser capable of direct modulation and outputs pulse light. The first optical filter inputs the pulse light outputted from the semiconductor laser, and outputs, while separating a wavelength band of the inputted pulse light into a shorter wavelength side and a longer wavelength side with reference to a peak wavelength of the inputted pulse light, the attenuated pulse light after attenuating the optical power on one more than that on the other of the shorter wavelength side and the longer wavelength side. The optical amplifier includes a predetermined optical amplification medium and amplifies the pulse light outputted from the first optical filter. In the pulse light source having the MOPA structure, the pulse light outputted from the directly-modulated semiconductor laser is amplified by the optical amplifier, after having been attenuated on one more than the other of the shorter wavelength side and the longer wavelength side of the wavelength band of the pulse light by the first optical filter.

In the pulse light source according to the present invention, the first optical filter preferably outputs the pulse light after having attenuated its inputted light components on the shorter wavelength side than the longer wavelength side of the wavelength band of the pulse light with reference to the peak wavelength of the pulse light. The first optical filter preferably has variable transmittance characteristics. Further, the pulse light source preferably further comprises a second optical filter disposed so as to sandwich the optical amplification medium included in the optical amplifier with the first optical filter. One of the first optical filter and the second optical filter is preferably a band-pass filter. Both of the first optical filter and the second optical filter may be the band-pass filters. At this time, a full width at half maximum of a transmission spectrum in the second optical filter located on the down-stream side of the optical amplification medium is preferably wider than a full width at half maximum of a transmission spectrum of the first optical filter located on the up-stream side of the optical amplification medium. Further, when both of the first optical filter and the second optical filter are the band-pass filters, the center wavelength in the transmission filter of the second optical filter may be set between the peak wavelength of the pulse light and the center wavelength in the transmission filter of the first optical filter. The semiconductor laser is preferably a Fabry-Perot type semiconductor laser. The semiconductor laser is provided with a temperature adjustment means adjusting the temperature thereof. The pulse light outputted from the optical amplifier preferably has a pulse width of less than 1 ns. The pulse light outputted from the optical amplifier preferably has a peak power of exceeding 1 kW. The pulse light preferably has a peak power of exceeding 10 kW in the case that a repetition frequency is 1 MHz.

A pulse compression method according to the present invention performs pulse compression by utilizing the pulse light source (pulse light source according to the present invention) which comprises the semiconductor laser, the first optical filter, and the optical amplifier, as described above. In particular, the pulse compression method according to the present invention attenuates the inputted light components on one more than the other of the shorter wavelength side and the longer wavelength side of the output spectrum of the semiconductor laser with reference to the peak wavelength of the pulse light, by the pulse light source adjusting a relative positional relationship between the transmission wavelength band of the optical filter and the output spectrum of the semiconductor laser.

In the pulse compression method according to the present invention, the first optical filter preferably outputs, while separating a wavelength band of the inputted pulse light into a shorter wavelength side and a longer wavelength side with reference to a peak wavelength of the inputted pulse light, the attenuated pulse light after attenuating the optical power on the shorter wavelength side more than that on the longer wavelength side. The first optical filter preferably has the variable transmission characteristics. The second optical filter may be disposed so as to sandwich the optical amplification medium included in the optical amplifier with the first optical filter. At least one of the first optical filter and the second optical filter is preferably the band-pass filter. Both of the first optical filter and the second optical filter may be the band-pass filters. In this case, the full width at half maximum of the transmission spectrum in the second optical filter is preferably wider than the full width at half maximum of the transmission spectrum in the first optical filter. Further, when both of the first optical filter and the second optical filter are the band-pass filters, the center wavelength in the transmission filter of the second optical filter may be set between the peak wavelength of the pulse light and the center wavelength in the transmission filter of the first optical filter. The semiconductor laser is preferably the Fabry-Perot type. Further, the semiconductor laser is preferably provided with the temperature adjustment means adjusting temperature thereof.

The present invention will be more fully understood from the detailed description given hereinbelow and the accompanying drawings, which are given by way of illustration only and are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the scope of the invention will be apparent to those skilled in the art from this detailed description.

DESCRIPTION OF THE PREFERRED EMBODIMENTS

Figure 1:
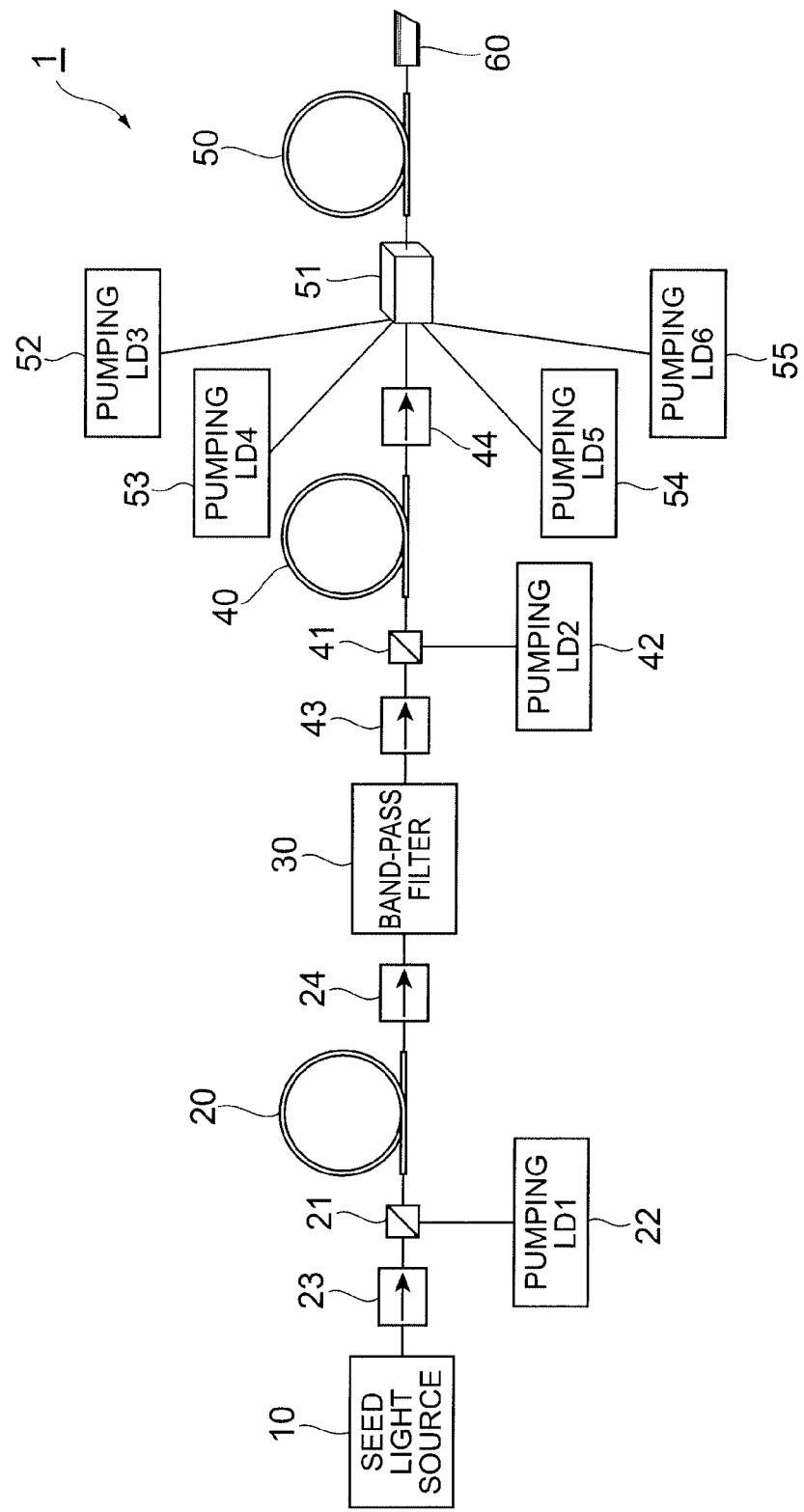
FIG. 1 shows a configuration of a first embodiment of a pulse light source according to the present invention.

In the following, embodiments of a pulse light source and a pulse compression method according to the present invention will be explained in detail with reference to FIGS. 1-4, 4A, 4B, 5-6, 7A-7C, 8, 9A-10C, and 11-14. In the description of the drawings, identical or corresponding components are designated by the same reference numerals, and overlapping description is omitted.

FIG. 1 shows a configuration of a first embodiment of a pulse light source according to the present invention. The pulse light source 1, as shown in FIG. 1, comprises a seed light source 10, an YbDF (Yb-Doped Fiber) 20, a band-pass filter 30, and YbDFs 40 and 50, and so on, and has the MOPA structure. This pulse light source 1 outputs pulse light having a wavelength around 1060 nm which is suitable for laser machining.

The seed light source 10 includes a semiconductor laser which is directly modulated and outputs pulse light. This semiconductor laser is preferred to be a Fabry-Perot type, from a viewpoint of achieving higher power and also from a viewpoint of avoiding non-linear effects such as stimulated Brillouin scattering (SBS). Further, the semiconductor laser outputs pulse light with the wavelength of around 1060 nm, at which the amplification optical fibers of the YbDFs 20, 40, and 50 have gains. The YbDFs 20, 40, and 50 are optical fibers which is mainly composed of silica glass and whose core is doped with Yb element as an activator. They have an advantage that the wavelengths of pumping light and light to be amplified are close to each other and a high power conversion efficiency is obtained, and an advantage that a high gain is obtained in the vicinity of the wavelength 1060 nm. These YbDFs 20, 40, and 50 constitute a three-stage optical fiber amplifier.

The first stage YbDF 20 is provided with forward direction supply of the pumping light which is outputted from a pumping light source 22 and transmitted through an optical coupler 21. Then, the YbDF 20 inputs the pulse light which is outputted from the seed light source 10 and transmitted through an optical isolator 23 and the optical coupler 21, and amplifies the inputted pulse light and outputs the amplified pulse light via an optical isolator 24.

The band-pass filter 30 inputs the pulse light which is outputted from the seed light source 10 and amplified by the first stage YbDF 20, and outputs, while separating a wavelength band of the inputted pulse light into a shorter wavelength side and a longer wavelength side with reference to a peak wavelength of the inputted pulse light, the attenuated pulse light after attenuating the optical power on one more than that on the other of the shorter wavelength side and the longer wavelength side. Note that a high-pass filter or a low-pass filter may be used instead of the band-pass filter, but the high-pass filter can cut out only the longer wavelength side of the seed light source spectrum and the low-pass filter can cut out only the shorter wavelength side of the seed light source spectrum. The band-pass filter has the both functions and is preferable for this purpose.

The second stage YbDF 40 is provided with forward direction supply of the pumping light which is outputted from a pumping light source 42 and transmitted through an optical coupler 41. Then, the YbDF 40 inputs the pulse light which is outputted from the band-pass filter 30 and transmitted through an optical isolator 43 and the optical coupler 41, and amplifies the inputted pulse light and outputs the amplified pulse light via an optical isolator 44. The third stage YbDF 50 is provided with forward direction supply of pumping the light which is outputted from each of pumping light sources 52 and 55 and transmitted through a combiner 51. Then, the YbDF 50 inputs the pulse light amplified by the second stage YbDF 40, and further amplifies the inputted pulse light and outputs the amplified pulse light to outside via an end gap 60.

A more preferable configuration example is as follows. The first stage YbDF 20 uses a core pumping method, and inputs the pumping light, which has a constant power of 200 mW at a pumping wavelength of 975 nm, in the forward direction. The YbDF 20 uses a 5 m long optical fiber having an unsaturated absorption coefficient of 240 dB/m at the wavelength of 975 nm. The core of the YbDF 20 has a diameter of 6 μm and a NA of approximately 0.12. The second stage YbDF 40 uses the core pumping method, and inputs the pumping light, which has a constant power of 200 mW at the pumping wavelength of 975 nm, in the forward direction. The YbDF 40 uses a 7 m long optical fiber having an unsaturated absorption coefficient of 240 dB/m at the wavelength of 975 nm. The core of the YbDF 40 has a diameter of 6 μm and a NA of approximately 0.12. The third YbDF 50 uses a cladding-pumping method, and inputs the pumping lights, which have a power of 20 W (four pumping LDs of a 5 W class) at the pumping wavelength of 975 nm, in the forward direction. The YbDF 50 uses a 5 m long optical fiber having an unsaturated absorption coefficient in the core of 1200 dB/m. The core of the YbDF 50 has a diameter of 10 μm and a NA of approximately 0.06. The inner cladding of the YbDF 50 has an outer diameter of 125 μm and a NA of approximately 0.46.

Figure 2:
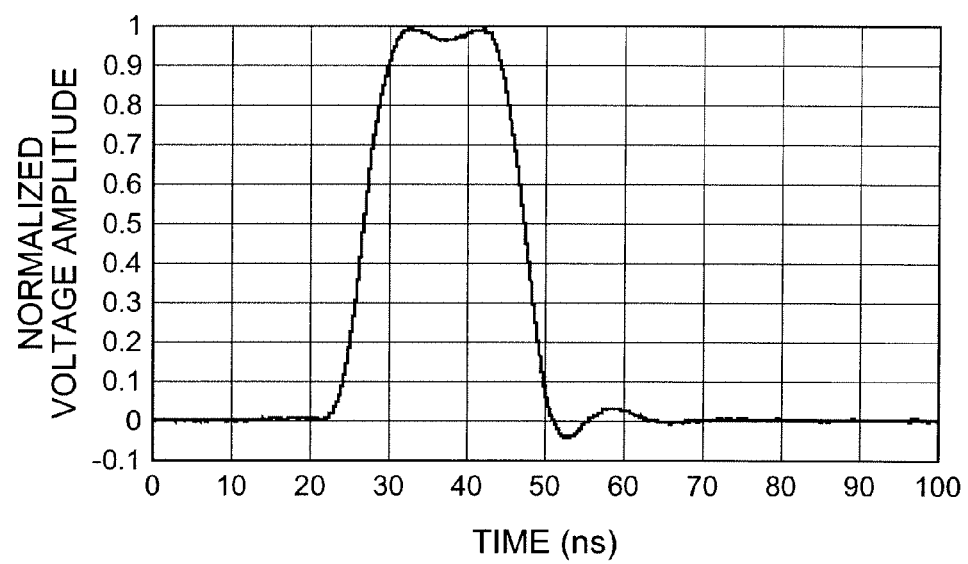
FIG. 2 is a graph showing a modulated voltage waveform in direct modulation of a semiconductor laser.
Figure 3:
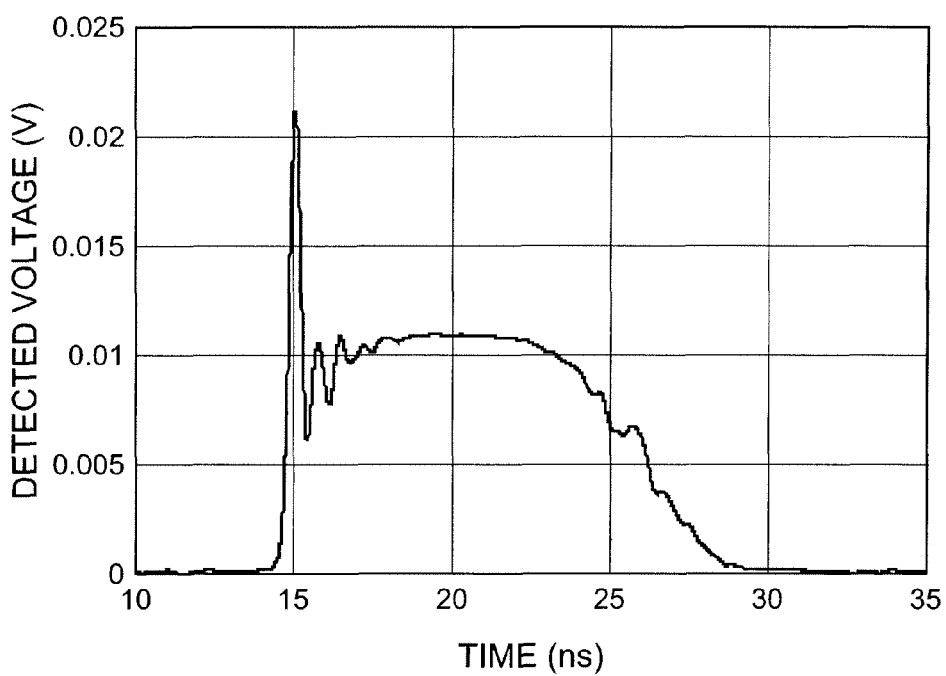
FIG. 3 is a graph showing a time waveform of pulse light outputted from a semiconductor laser.

FIG. 2 is a graph showing a modulation voltage waveform for the direct modulation of a semiconductor laser. Further, FIG. 3 is a graph showing a time waveform of pulse light outputted from the semiconductor laser. In FIG. 2, the repletion frequency is set to be 100 kHz. The maximum modulated current amplitude of 240 mA is obtained for the rise time and fall time of the modulated voltage waveform shown in FIG. 2. In the time waveform of the pulse light outputted from the semiconductor laser which is provided with this modulation signal, an over shoot half width is less than 1 ns as shown in FIG. 3, but a pulse component with a width exceeding 10 ns exists following the overshoot and this pulse component causes the heat effect in the laser machining. Meanwhile, it is difficult to keep the current amplitude of 240 mA when the modulation signal width is reduced to be less than 1 ns.

In the case that the semiconductor laser has a single wavelength oscillation such as in DFB or the like, a relationship between optical output power P and optical frequency change Δν (so called chirping) of the oscillation is given by the following Formulas 1a and 1b. Here, a is a line width increase coefficient, Γ is a confinement coefficient of an active layer, ∈ is a non-linear gain coefficient, V is an active layer volume, h is the Planck's constant, and ν is an optical frequency of a seed light source output.

$$\Delta v = \frac{\alpha}{4\pi}\left(\frac{1}{P} \cdot \frac{\partial P}{\partial t} + \kappa P\right) \quad (1a)$$

$$\kappa = \frac{2\Gamma\varepsilon}{Vh\nu} \quad (1b)$$

Figure 4A:
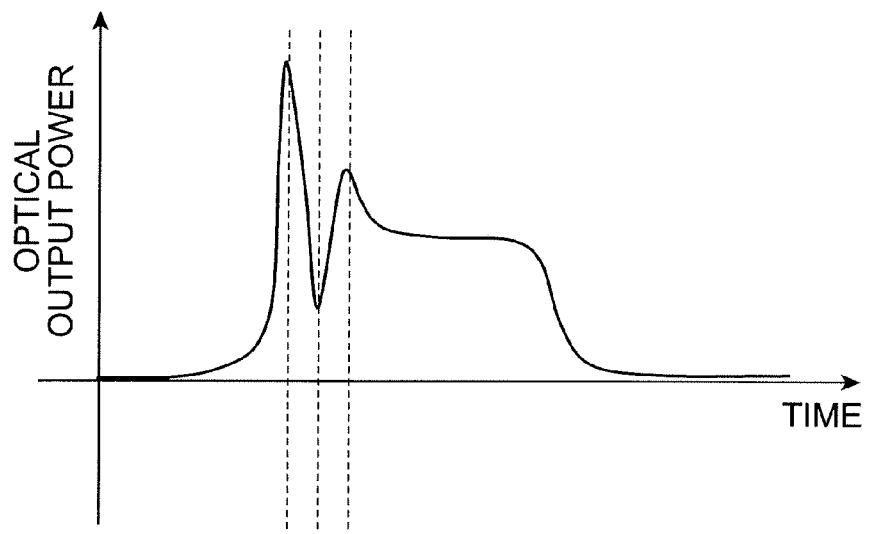
FIG. 4A is a graph showing a time waveform of pulse light outputted from a semiconductor laser.
Figure 4B:
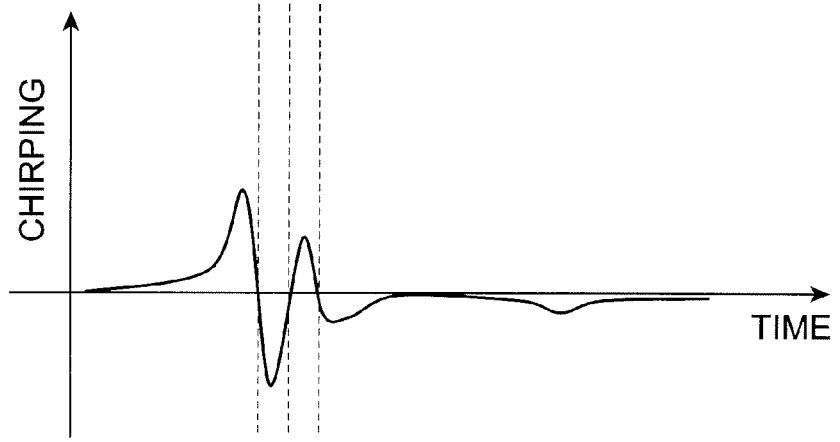
FIG. 4B is a graph showing a time change of chirping in pulse light outputted from a semiconductor laser.

FIG. 4A is a graph showing a time waveform of the pulse light outputted from the semiconductor laser, and FIG. 4B is a graph showing time change of the chirping in the pulse light outputted from the semiconductor laser. As apparent from the above Formulas 1a and 1b, the chirping Δν depends on a time derivation of the optical output power P. Therefore, as shown in FIGS. 4A and 4B, the approximately maximum chirping occurs at the largest change of the optical output power P. Then, since the most distinguished change of the optical output occurs at the overshoot of the rising, the chirping occurs generally at a high frequency (i.e., on the shorter wavelength side) and has a spectrum shape with a long tail in the short wavelength side even in the semiconductor laser of the Fabry-Perot type.

Here, when the center wavelength of the band-pass filter 30 included in the pulse light source 1 shown in FIG. 1 is shifted intentionally from the maximum intensity wavelength of the output light spectrum of the seed light source 10 toward the shorter wavelength side or the longer wavelength side thereof, only the chirping component shown in FIG. 4 can be cut out and it is possible to remove the pulse continuing in more than 10 ns after the overshoot as shown in FIG. 3. Note that this method obviously cuts most of the output power of the seed light source 10 by the band-pass filter 30, and therefore the YbDFs 20, 40, and 50 are provided for compensating this output cut. The optical fiber amplifier part including these YbDFs 20, 40, and 50 has a potential to provide a sufficient gain and can realize a gain of several tens of dB.

Figure 5:
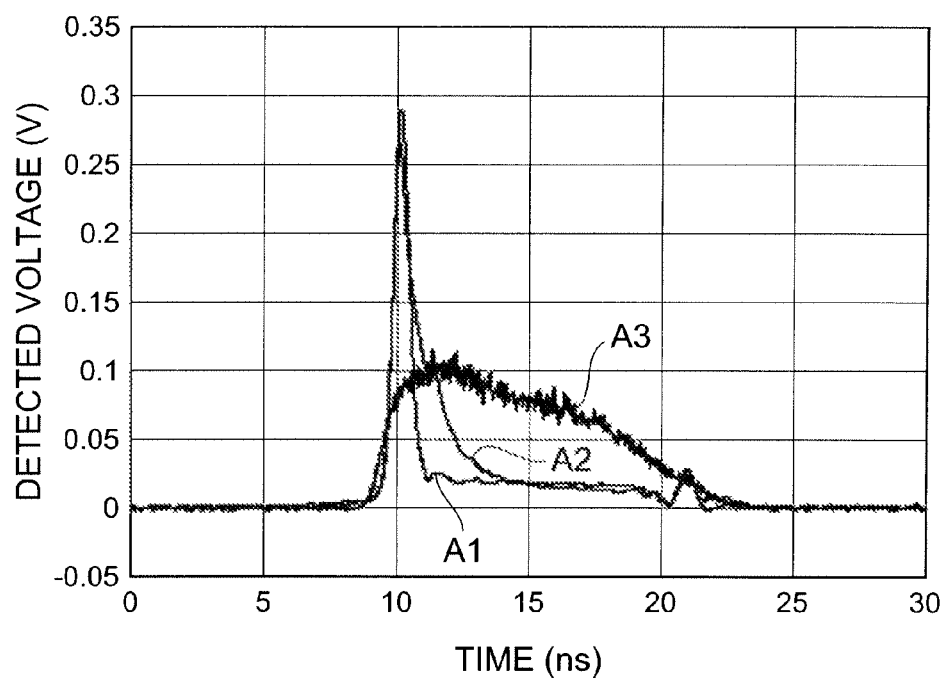
FIG. 5 is a graph showing time waveforms of pulse light outputted from the pulse light source according to the first embodiment.

FIG. 5 is a graph showing the time waveform of the pulse light outputted from the pulse light source 1 according to the first embodiment. Here, by use of a band-pass filter, in which the transmittance wavelength band is variable, the transmittance wavelength band of the band-pass filter 30 is adjusted. In FIG. 5, the time waveform A1 is measured when the transmittance wavelength band of the band-pass filter 30 is shifted to the longer wavelength side as much as possible and also the pulse peak is maximized. The time waveform A2 is measured when the transmittance wavelength of the band-pass filter 30 is shifted to the shorter wavelength side as much as possible and also the pulse peak is maximized. Further, the time waveform A3 is measured when the transmittance waveform of the band-pass filter 30 overlaps the output spectrum of the seed light source 10 as precisely as possible.

As shown in FIG. 5, the pulse peak even increases by the effect of the optical fiber amplifier part of the YbDFs 20, 40, and 50. Note that, when the center wavelength of the band-pass filter 30 is shifted too much against the seed light source spectrum, the light obviously cannot transmit the band-pass filter 30. The time waveforms A1 and A2 in FIG. 5 are obtained when the transmittance wavelength band of the band-pass filter 30 is adjusted to the longer wavelength side or the shorter wavelength side, respectively, such that the pulse peak is maximized. Then, when the center wavelength in the transmission wavelength band of the band-pass filter 30 is shifted to fit the longer wavelength side of the seed light source spectrum, an approximately 10% higher pulse peak and a sharper pulse fall are obtained than in the case in which the center wavelength is shifted to fit the shorter wavelength side, and the heat effect is expected to be suppressed in the laser machining.

Figure 6:
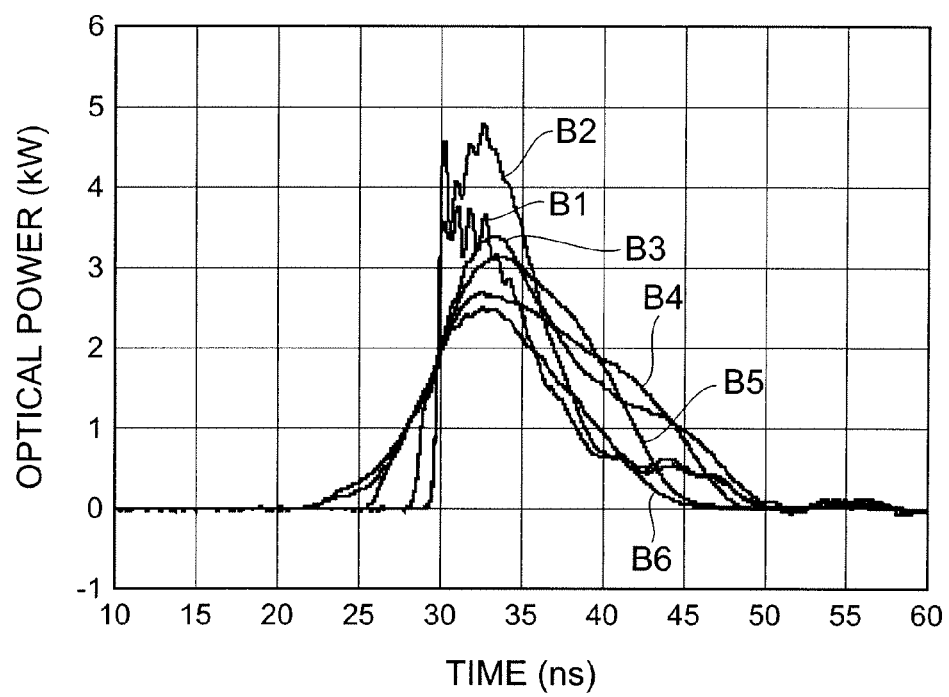
FIG. 6 is a graph showing time waveforms of pulse light outputted from the pulse light source according to the first embodiment.

Note that, while the semiconductor laser has largely-distributed transient response characteristics among samples, the result shown in FIG. 6 is obtained even when the semiconductor laser, which does not have overshoot at all, is used for the seed light source 10, and a preferable result is obtained there also when the center wavelength of the band-pass filter 30 is shifted to fit the longer wavelength side of the seed light source spectrum. FIG. 6 is a graph showing the time waveform of the pulse light outputted from the pulse light source 1 when the semiconductor laser, which does not have overshoot at all, is used for the seed light source 10. In FIG. 6, the time waveform B1 is obtained when the transmittance wavelength band of the band-pass filter 30 is shifted to the longer wavelength side as much as possible and also the pulse peak is maximized. The time waveforms B2 to B6 are measured when the transmittance wavelength band of the band-pass filter 30 is shifted gradually to the shorter wavelength side from the position for the time waveform B 1. As apparent from FIG. 6, a preferable result is obtained when the center wavelength of the band-pass filter 30 is shifted to fit the longer wavelength side of the seed light source spectrum.

The above description explains the method to make the transmittance spectrum of the band-pass filter 30 to be variable for adjusting the relative positional relationship between the seed light source spectrum and the transmission spectrum of the band-pass filter 30, but almost the same effect can be expected to be obtained by adjustment of the temperature in the seed light source 10. While the adjustment of the band-pass filter 30 requires mechanical adjustment such as angle adjustment of a dielectric multilayer film, the temperature adjustment of the seed light source 10 can be carried out only by electronic control and has advantages in reproducibility and controllability.

As described above, the pulse light source 1 according to the first embodiment is a pulse light source, which has the MOPA structure using the seed light source of the semiconductor laser modulated directly with a modulation amplitude of exceeding 200 mA, and can easily output pulse light having a pulse width with a sub-nanosecond. In particular, the pulse light source 1 according to the first embodiment can output the pulse light having a peak power of exceeding 1 kW and a pulse width of less than 1 ns, and therefore the pulse light source 1 is preferable for application to the laser machining. Further, the pulse light source 1 according to the present embodiment directly modulates the semiconductor laser included in the seed light source 10 and has a high degree of freedom in the modulation compared to the mode lock.

Meanwhile, the pulse light source 1 in the configuration shown in FIG. 1 uses the Fabry-Perot type semiconductor laser as the seed light source 10. For realizing the short pulse, as shown in FIGS. 7A and 7B, the center wavelength of the band-pass filter 30, which is provided in the subsequent stage of the seed light source 10, is adjusted so as to obtain the state of C2 or C3 in the drawings, and thereby the full width at half maximum of the pulse can be compressed approximately from 5 ns to 0.5 ns.

Figure 7A:
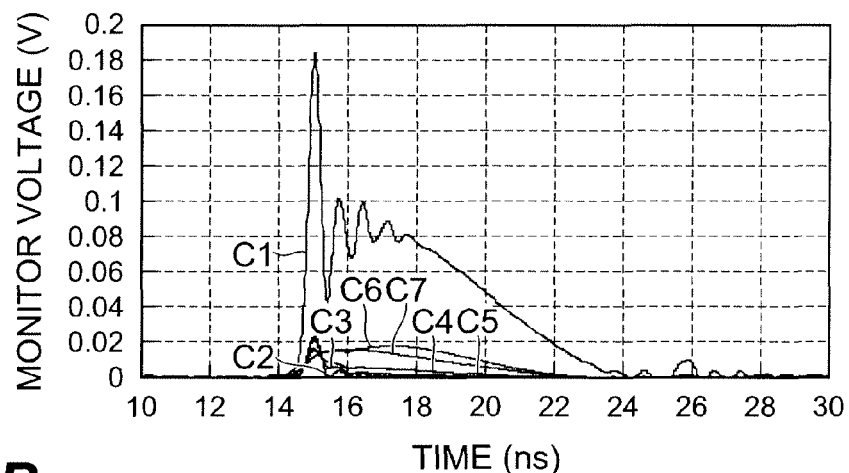
FIGS. 7A to 7C show pulse waveforms and spectra when the pulse light outputted from the seed light source is modified by adjustment of the center wavelength of the band-pass filter provided in the subsequent stage of the seed light source.
Figure 7B:
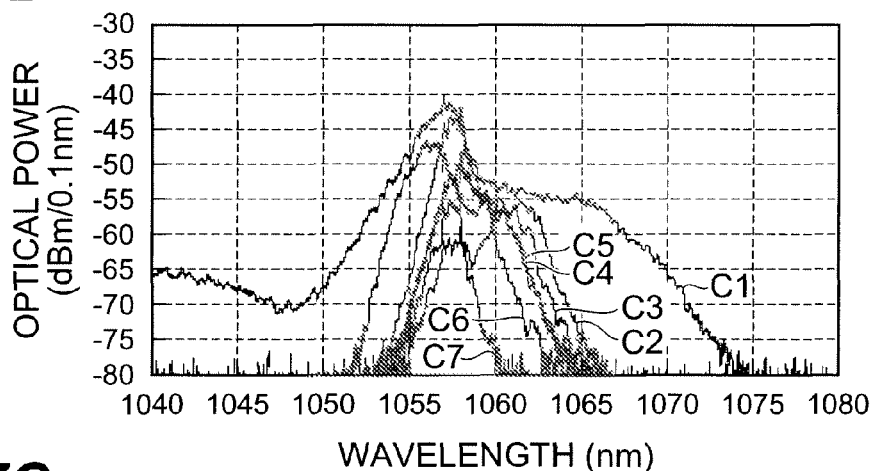
Figure 7C:
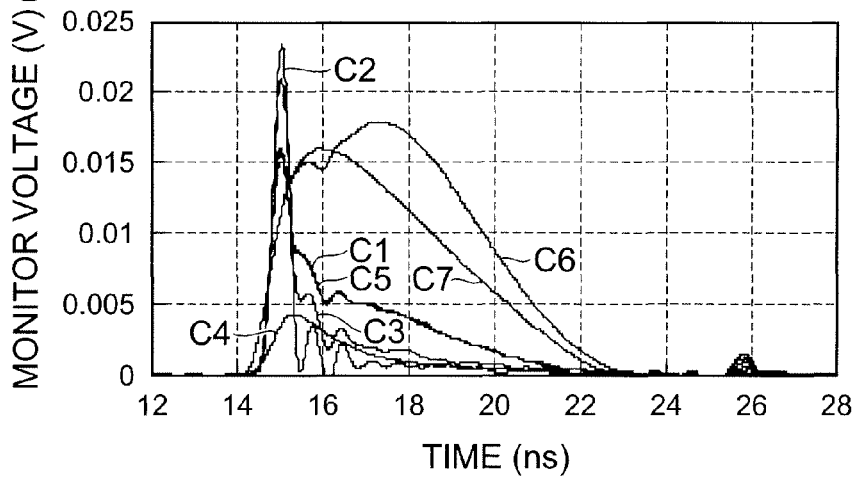

FIG. 7A shows a pulse waveform in the case of modifying the pulse light outputted from the seed light source 10 by adjusting the center wavelength of the band-pass filter 30 provided in the subsequent stage of the seed light source 10. FIG. 7B shows the spectrum in this case. Further, FIG. 7C shows an enlarged part of FIG. 7A. The plot C1 in the drawing shows a case without the band-pass filter. The plots C2 to C7 show cases of shifting the center wavelength of the band-pass filter gradually from the longer wavelength side to the shorter wavelength side.

Note that, when the center wavelength of the band-pass filter 30 is de-tuned largely from the center wavelength of the seed light source spectrum as in the cases of the plots C2 and C3, ASE generated in the YbDF in the downstream increases. For suppressing such an ASE component, a plurality of band-pass filters are preferably inserted inside the optical amplifier coupled in the downstream of the seed light source, as shown in FIG. 8.

Figure 8:
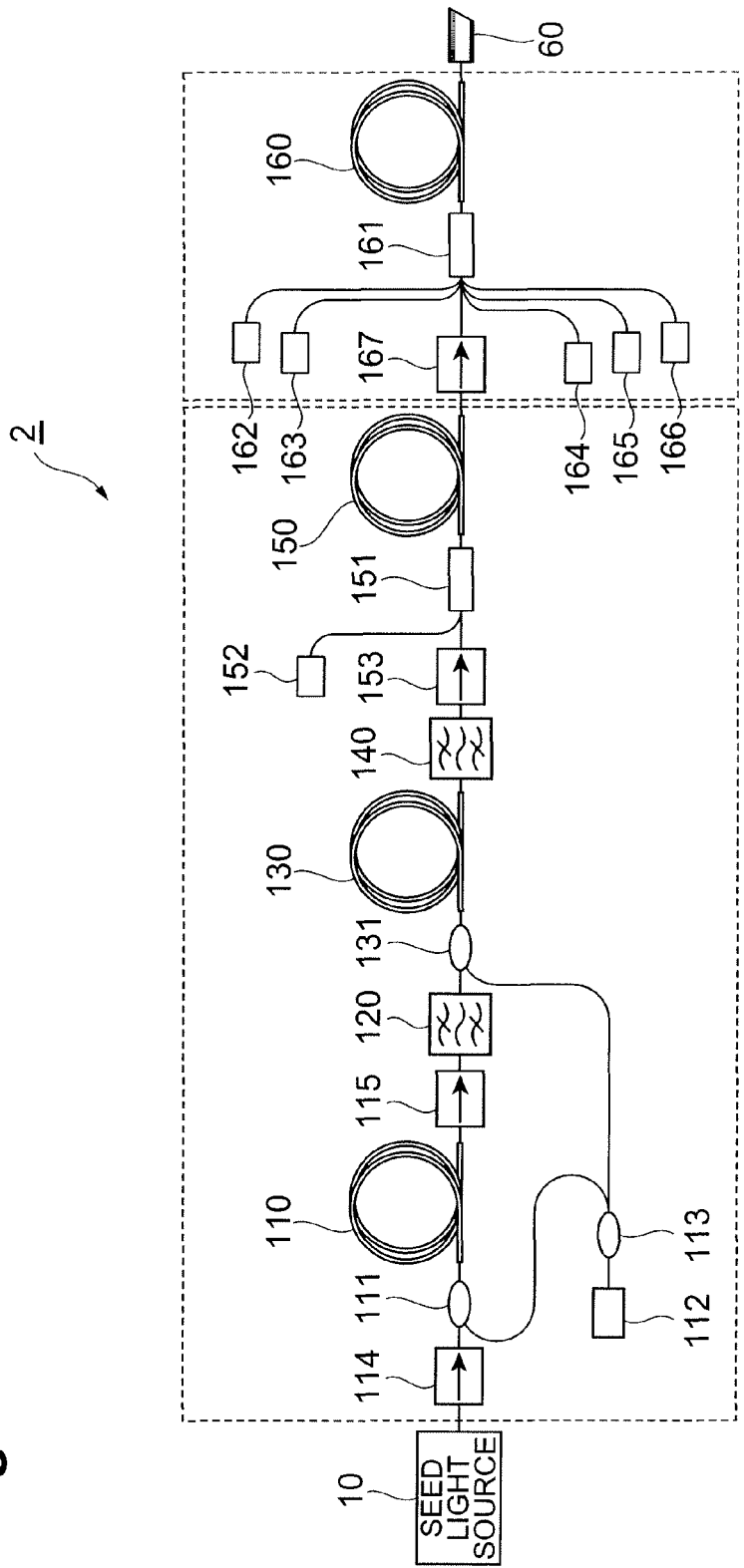
FIG. 8 shows a configuration of a second embodiment of a pulse light source according to the present invention.

FIG. 8 shows a configuration of a second embodiment of a pulse light source 2 according to the present invention. The pulse light source 2 shown in this FIG. 8 comprises a seed light source 10, an YbDF 110, a band-pass filter 120, an YbDF 130, a band-pass filter 140, an YbDF 150, an YbDF 160, and so on, and has the MOPA structure. This pulse light source 2 outputs pulse light having a wavelength of around 1060 nm which is suitable for the laser machining.

The YbDFs 110, 130, 150, and 160 amplify the pulse light which is outputted from the seed light source 10 and has the wavelength around 1060 nm, and are optical fibers which are comprised of glass and have the Yb element added to the core thereof as an activator. Each of the YbDF 110, 130, 150, and 160 has a pumping light wavelength that is close to the wavelength of light to be amplified, and has an advantage in the point of power conversion efficiency and also an advantage of realizing a high gain around the wavelength of 1060 nm. These YbDFs 110, 130, 150, and 160 constitute a four stage optical fiber amplifier.

The first stage YbDF 110 is provided with forward supply of pumping light which is outputted from a pumping light source 112 and transmitted through an optical coupler 113 and an optical coupler 111. Then, the YbDF 110 inputs pulse light which is outputted from the seed light source 10 and is transmitted through an optical isolator 114 and the optical coupler 111, and amplifies the inputted pulse light and outputs the amplified pulse light via an optical isolator 115.

The band-pass filter 120 inputs the pulse light which is amplified by the first stage YbDF 110 and transmitted through the optical isolator 115, and outputs, while separating a wavelength band of the inputted pulse light into a shorter wavelength side and a longer wavelength side with reference to a peak wavelength of the inputted pulse light, the attenuated pulse light after attenuating the optical power on one more than that on the other of the shorter wavelength side and the longer wavelength side.

The second stage YbDF 130 is provided with forward supply of the pumping light which is outputted from the pumping light source 112 and transmitted through the optical coupler 113 and an optical coupler 131. Then, the YbDF 130 inputs the pulse light which is outputted from the band-pass filter 120 and transmitted through the optical coupler 131, and amplifies the inputted pulse light and outputs the amplified pulse light.

The band-pass filter 140 inputs the pulse light amplified by the second stage YbDF 130, and outputs, while separating a wavelength band of the inputted pulse light into a shorter wavelength side and a longer wavelength side with reference to a peak wavelength of the inputted pulse light, the attenuated pulse light after attenuating the optical power on one more than that on the other of the shorter wavelength side and the longer wavelength side.

The third stage YbDF 150 is provided with forward supply of the pumping light which is outputted from a pumping light source 152 and transmitted through an optical coupler 151. Then, the YbDF 150 inputs the pulse light which is outputted from the band-pass filter 140 and transmitted through an optical isolator 153, and amplifies the inputted pulse light and outputs the amplified pulse light.

The fourth stage YbDF 160 is provided with forward supply of the pumping light which is outputted from each of pumping light sources 162 to 166 and transmitted through a combiner 161. Then, the YbDF 160 inputs the pulse light which is amplified by the third stage YbDF 150 and transmitted through the optical isolator 167 and the combiner 161, and amplifies the inputted pulse light further more and outputs the amplified pulse light to outside via an end gap 60.

A more preferable configuration example is as follows. The first stage YbDF 110 is a single cladding Al-codoped silica-based YbDF, and has an Al concentration of 5 wt %, a core diameter of 10 μm, a cladding diameter of 125 μm, a non-saturation absorption of 70 dB/m for the pumping light at a 915 nm band, a non-saturation absorption peak of 240 dB/m for the pumping light at a 975 nm band, and a length of 7 m. The second stage YbDF 130 is a single cladding Al-codoped silica-based YbDF, and has a Al concentration of 5 wt %, a core diameter of 10 μm, a cladding diameter of 125 μm, a non-saturation absorption of 70 dB/m for the pumping light at the 915 nm band, a non-saturation absorption peak of 240 dB/m for the pumping light at the 975 nm band, and a length of 7 m.

The third stage YbDF 150 is a double-cladding phosphate-glass-based YbDF, and has a P concentration of 26.4 wt %, an Al concentration of 0.8 wt %, a core diameter of 10 μm, a first cladding diameter of approximately 125 μm, an octagonal shape in the cross-section of the first cladding, a non-saturation absorption of 1.8 dB/m for the pumping light at the 915 nm band, and a length of 3 m. The fourth stage YbDF 160 is a double-cladding Al-codoped silica-based YbDF, and has an Al concentration of 5 wt %, a core diameter of 10 μm, a cladding diameter of 125 μm, a non-saturation absorption of 80 dB/m for the pumping light at the 915 nm band, and a length of 3.5 m.

All the wavelengths of the pumping lights supplied to the YbDFs 110, 130, 150, and 160 are in the 0.975 μm band. The pumping light supplied to the YbDF 110 has a power of 200 mW in a single mode. The pumping light supplied to the YbDF 130 has a power of 200 mW in a single mode. The pumping light supplied to the YbDF 150 has a power of 2 W in multi modes. Further, the pumping light supplied to the YbDF 160 has a power of 14 W in multi modes.

Each of the band-pass filters 120 and 140 has a full width at half maximum of the transmission spectrum of 3 nm. FIGS. 9A, 9B, 10A, 10B, and 10C are diagrams showing exemplarily states of the ASE removal by the band-pass filters 120 and 140 in the pulse light source 2 according to the second embodiment.

Figure 9A:
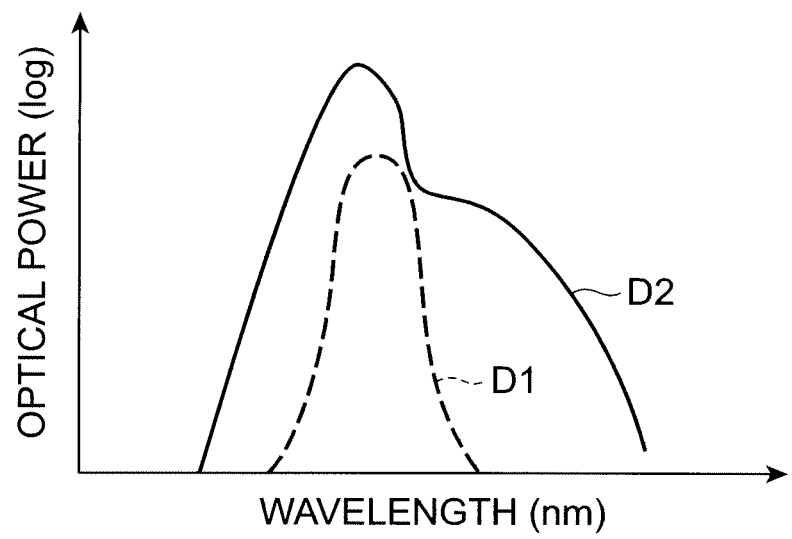
FIGS. 9A and 9B are graphs showing exemplarily a state of ASE removal by the band-pass filters in the pulse light source according to the second embodiment.
Figure 9B:
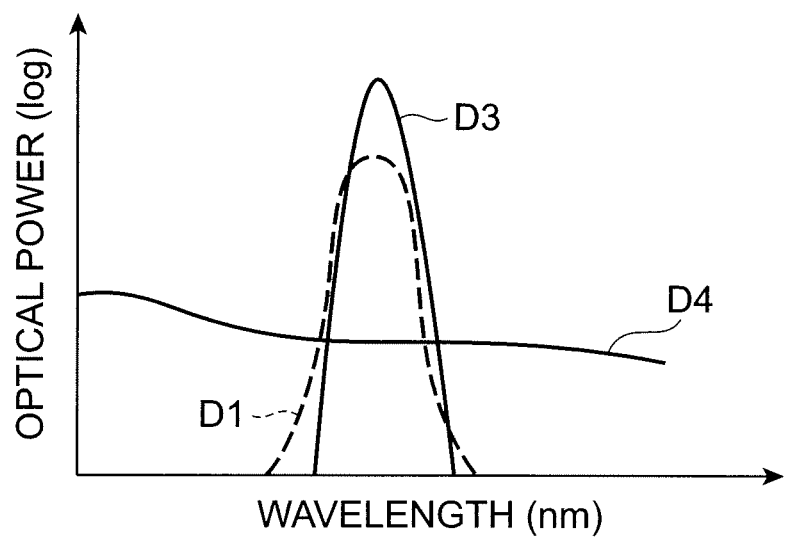

As shown in FIGS. 9A and 9B, when the center wavelength in the transmission spectrum of the band-pass filter 120 (D1 in FIGS. 9A and 9B) roughly fits the peak wavelength in the output light spectrum of the seed light source 10 (D2 in FIGS. 9A and 9B), the power of the light outputted from the band-pass filter 120 (D3 in FIGS. 9A and 9B) can be maintained to be high, and an S/N ratio can be maintained to be high compared to the ASE component contained in the light outputted from the YbDF 130 in the subsequent stage (D4 in FIGS. 9A and 9B).

Figure 10A:
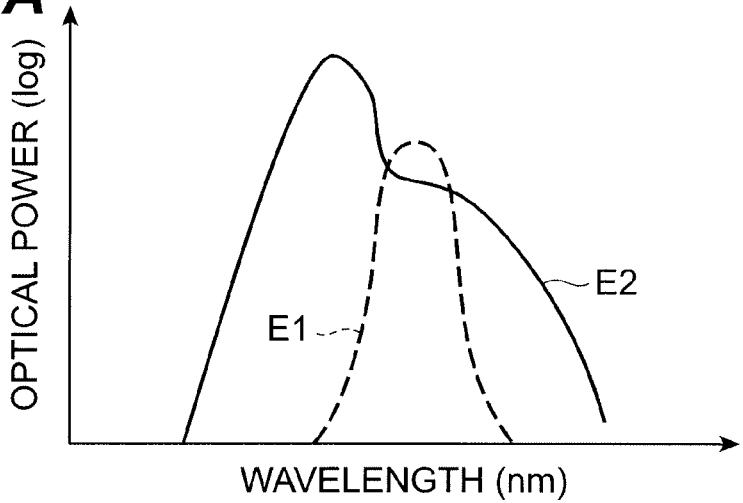
FIGS. 10A to 10C are graphs showing exemplarily a state of ASE removal by the band-pass filters in the pulse light source according to the second embodiment.
Figure 10B:
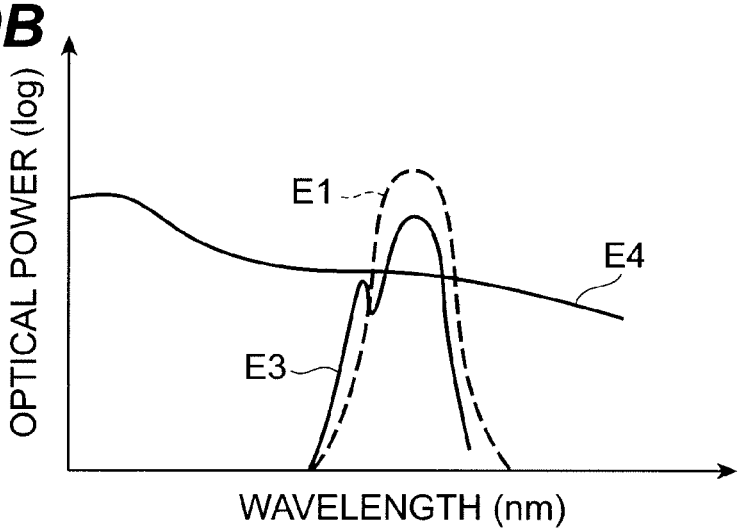
Figure 10C:
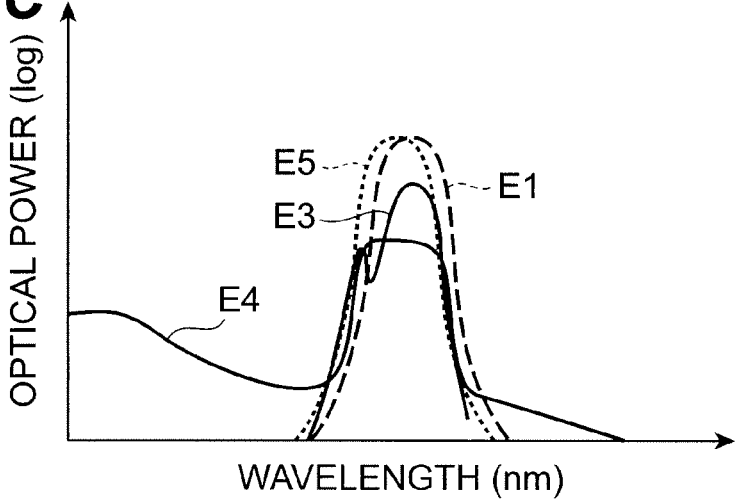

On the other hand, as shown in FIGS. 10A to 10C, when the center wavelength in the transmission spectrum of the band-pass filter 120 (E1 in FIGS. 10A to 10C) is shifted largely from the peak wavelength in the output light spectrum of the seed light source 10 (E2 in FIGS. 10A to 10C), the power of the light outputted from the band-pass filter 120 (E3 in FIGS. 10A to 10C) is attenuated largely from that of the input light and the S/N ratio is degraded considerably compared to the ASE component contained in the light outputted from the YbDF 130 in the subsequent stage (E4 in FIGS. 10A to 10C). For avoiding this problem, the band-pass filter 140 is inserted further in the downstream thereof, and the S/N ratio of the light outputted from the band-pass filter 120 (E5 in FIGS. 10A to 10C) can be improved. Note that, at this time, the center wavelength of the band-pass filter 140 is preferably set to be closer to the peak wavelength in the output spectrum of the seed light source 10 than the center wavelength of the band-pass filter 120.

In the pulse light source 2 shown in FIG. 8, when the seed light source 10 is oscillated continuously at an output power of 20 dBm for the above specific configuration, the pulse light outputted from the end gap has a power of 10.7 W. When the center wavelength of the band-pass filter 120 is shifted from the peak wavelength in the output spectrum of the seed light source 10 to the longer wavelength side, as the case of the plot C2 in FIGS. 7A to 7C, a time-averaged input power of the light inputted to the second stage YbDF 130 is reduced and the ASE outputted from the inside of the second stage YbDF 130 is increased. As a result, the output power of the light to be amplified against the ASE power (called S/N ratio for convenience) is lowered immediately after the second stage YbDF 130.

Figure 11:
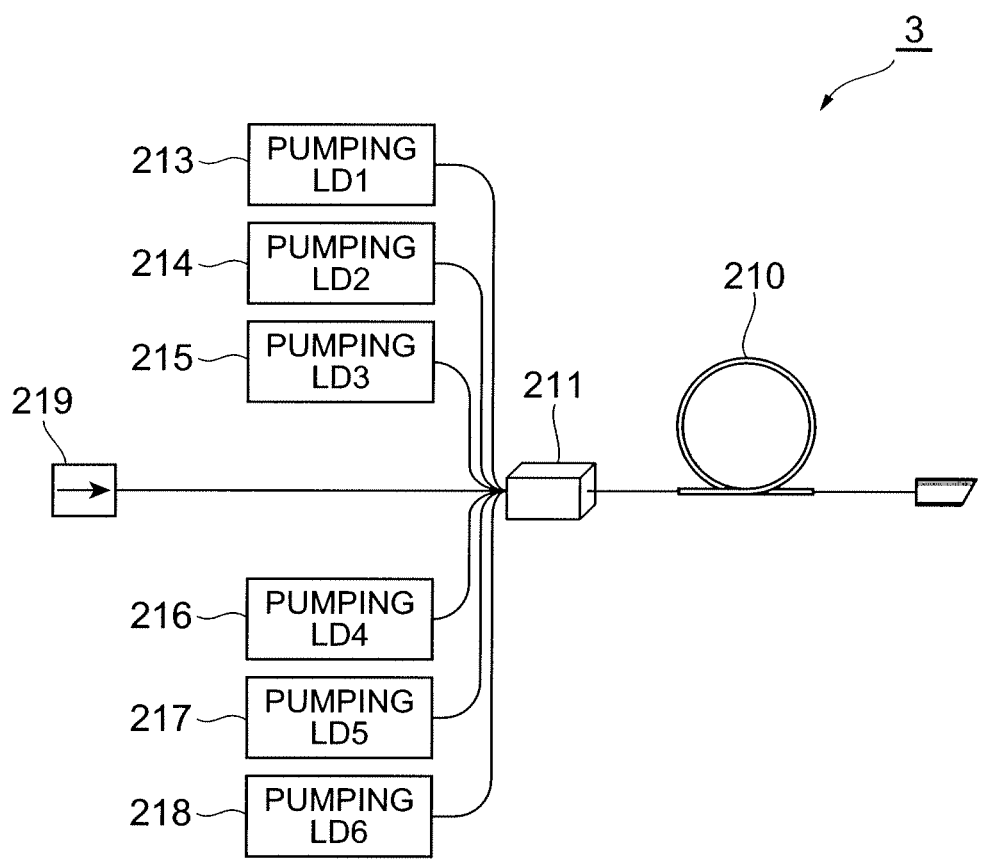
FIG. 11 shows a configuration of the ASE light source using the YbDF or the YbDF.
Figure 12:
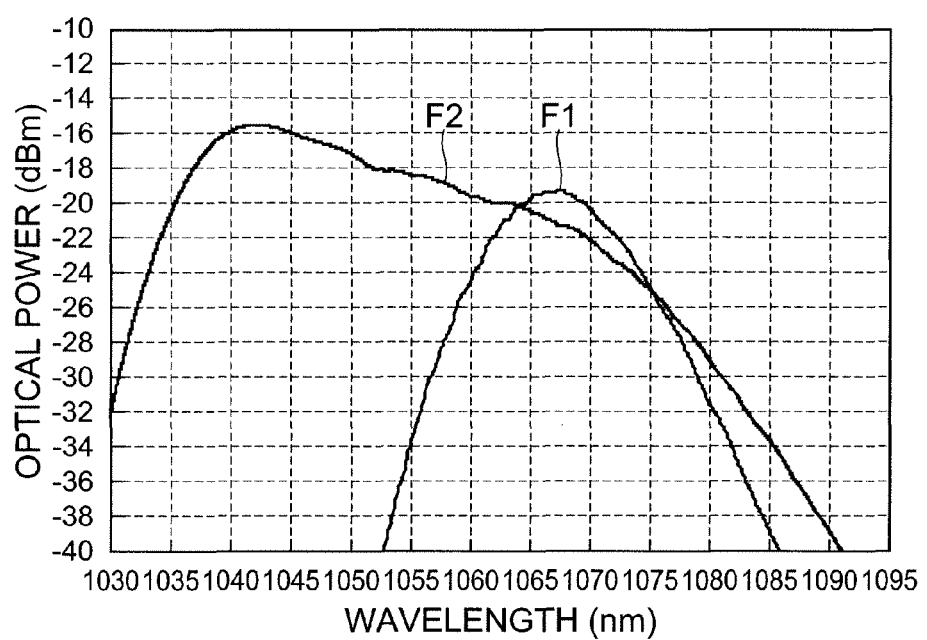
FIG. 12 shows an output light spectrum of the ASE light source using the YbDF or the YbDF.

By providing the band-pass filter 140 in the subsequent stage of the second YbDF 130 and also by using the phosphate glass YbDF, which has a narrow ASE band, for the third stage YbDF 150, it is possible to improve the S/N ratio as shown in FIGS. 11 and 12.

FIG. 11 is a diagram showing a configuration of an ASE light source 3 using the YbDF 150 or the YbDF 160. This ASE light source 3 outputs pumping light with a power of 7 W from each of six pumping light sources 213 to 218 and supplies this pumping light to an YbDF 210 via a combiner 211. The YbDF 150 (8 m) or the YbDF 160 (10 m) is used for the YbDF 210. The combiner 211 has a pumping light input port constituted by six multi-mode fibers, an input port constituted by one single-mode fiber for the light to be amplified, and an output port constituted by one double-cladding fiber. An isolator 219 reduces an optical back flow at the wavelength of 1060.

FIG. 12 shows an output spectrum of the ASE light source 3 using the YbDF 150 or the YbDF 160. This FIG. 12 shows the spectrum by the plot F1 when the input power of the ASE light source 3 is zero and the YbDF 150 is used for the YbDF 210, and shows the spectrum by the plot F2 when YbDF 160 is used for the YbDF 210. As shown in this FIG. 12, by using the phosphate-glass YbDF for the third stage YbDF 150, it is possible to improve the S/N ratio.

Figure 13:
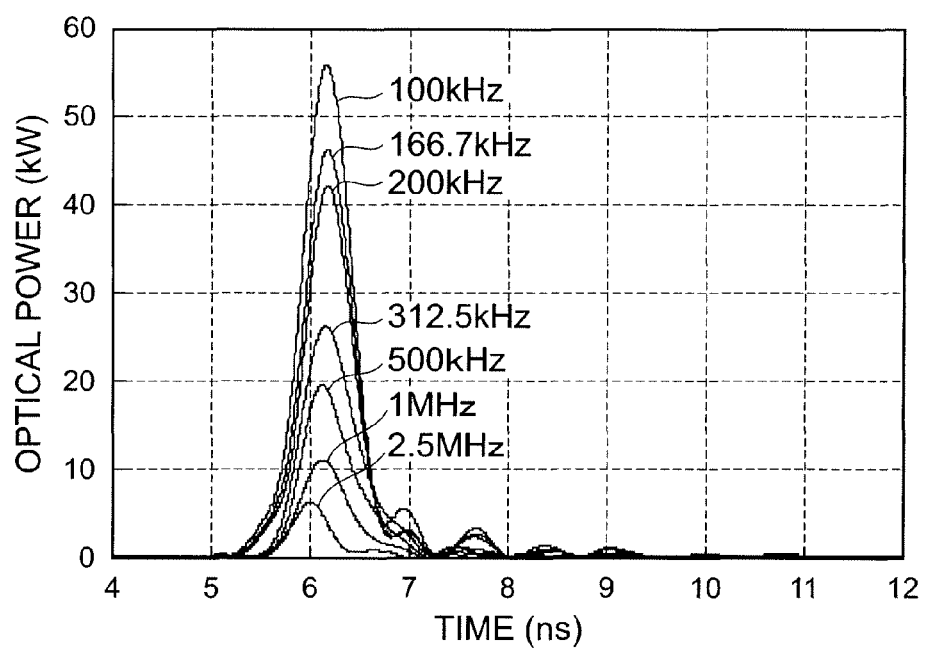
FIG. 13 is a graph showing pulse waveforms of the pulse light outputted from the pulse light source according to the second embodiment.
Figure 14:
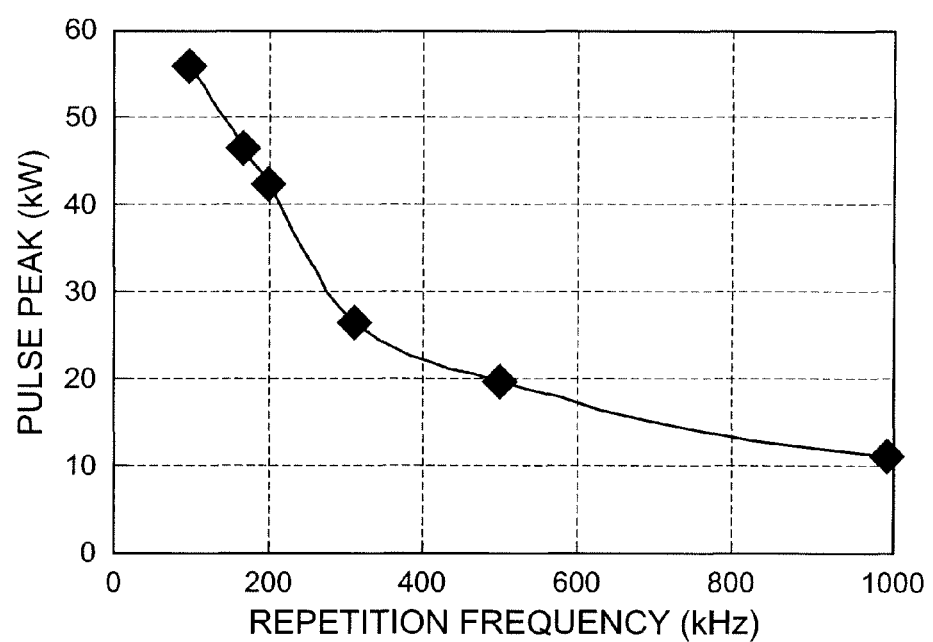
FIG. 14 is a graph showing a relationship between a repetition frequency and a pulse peak power of the pulse light outputted from the pulse light source according to the second embodiment.

FIG. 13 is a graph showing the waveform of the pulse light outputted from the pulse light source 2 according to the second embodiment. In FIG. 13, the repetition frequencies are 100 kHz, 166.7 kHz, 200 kHz, 312.5 kHz, 500 kHz, 1 MHz, and 2.5 MHz. FIG. 14 is a graph showing a relationship between the repetition frequency and the pulse peak power of the pulse light outputted from the pulse light source 2 according to the second embodiment. Note that, in the measurement of the pulse waveform, an spatial attenuator having an attenuation of approximately 65 dB was inserted after the end gap 60 located at an output end of the pulse light source 2, the light outputted from the end gap 60 was received by a photoelectric conversion module made by Thorlabs (SIRS-FC type), and the waveform of the electric output from the photoelectric conversion module was observed with an oscilloscope made by Yokogawa Electric (DL9240).

As shown in FIGS. 13 and 14, it is possible to realize a pulse peak of more than 10 kW even at an output pulse light repetition frequency of 1 MHz, and to realize a pulse peak of 56 kW at an output pulse light repetition frequency of 100 kHz. Note that the phosphate-glass YbDF for the third stage YbDF 150 has a lower pumping efficiency (ratio of the output power of the light to be amplified obtained at a specific pumping power) compared to the fourth stage YbDF 160. Accordingly, the Al-codoped silica-based YbDF is used for the last stage YbDF 160 in the configuration shown in FIG. 8.

The center wavelength of the band-pass filter 140 is preferably set to be closer to the peak wavelength in the output spectrum of the seed light source 10 than the center wavelength of the band-pass filter 120. Further, while the full width at half maximum of the transmission spectrum in each of the band-pass filters 120 and 140 has been assumed to be equally 3 nm, the spectrum of the light to be amplified after the transmission of the band-pass filter 120 has generally a wider band than the transmission spectrum original to the band-pass filter 120 as a result of an each other's shift between the peak wavelength of the output of the seed light source 10 and the center wavelength of the band-pass filter 120, and therefore, the full width at half maximum of the transmission spectrum of the band-pass filter 140 is preferably wider than the full width at half maximum of the transmission spectrum of the band-pass filter 120.

Note that the widening of the spectrum is at such a level that an original full width at half maximum of 3 nm in the transmission spectrum of the band-pass filter becomes a full width at half maximum of 4 nm in the spectrum after the transmission at a maximum as shown in the plot C2 of FIG. 7B. Therefore, the full width at half maximum in the transmission spectrum of the band-pass filter 140 is preferably about 1.5 times of that in the transmission spectrum of the band-pass filter 120 at a maximum.

Further, the band-pass filter is not always required to have two stages and may have three stages. Moreover, the band-pass filter itself is not always required and it is optional to use a combination of a short wavelength transmission filter (SWPF) and a long wavelength transmission filter (LWPF).

As described above, in accordance with the pulse light source according to the present invention, a pulse light source, which has the MOPA structure using, as a seed light source, a semiconductor laser directly modulated with a modulation amplitude of more than 200 mA, can be realized and pulse light with a sub-nanosecond pulse width can be easily outputted.

From the invention thus described, it will be obvious that the embodiments of the invention may be varied in many ways. Such variations are not to be regarded as a departure from the spirit and scope of the invention, and all such modifications as would be obvious to one skilled in the art are intended for inclusion within the scope of the following claims.

What is claimed is:

1. A pulse light source, comprising:
  a semiconductor laser being capable of direct modulation and outputting pulse light;
  a first optical filter provided on an optical path between the semiconductor laser and an output end of the pulse light source, the first optical filter inputting the pulse light from the semiconductor laser and selectively outputting a chirping component of the inputted pulse light either:
  after attenuating the optical power more on a shorter wavelength side than a longer wavelength side of a wavelength band of the pulse light, with reference to a max peak wavelength of the pulse light, or
  after attenuating the optical power more on the longer wavelength side than the shorter wavelength side of the wavelength band of the pulse light, with reference to the max peak wavelength of the pulse light; and
  a first optical amplifier provided on the optical path between the semiconductor laser and the output end, the first optical amplifier inputting the pulse light from the semiconductor laser and amplifying the inputted pulse light.

2. The pulse light source according to claim 1, wherein the semiconductor laser outputs the pulse light that overshoots at a rising thereof.

3. The pulse light source according to claim 1, wherein a center wavelength of a transmission spectrum of the first optical filter is adjustable.

4. The pulse light source according to claim 3, wherein the center wavelength of the transmission spectrum of the first optical filter is set in a long wavelength side from a peak wavelength of the pulse light.

5. The pulse light source according to claim 3, wherein the transmission spectrum of the first optical filter has a full width at half maximum of 3 nm.

6. The pulse light source according to claim 1, wherein the first optical filter is provided on an optical path between the semiconductor laser and the first optical amplifier.

7. The pulse light source according to claim 6, further comprising a second optical amplifier provided on an optical path between the semiconductor laser and the first optical filter.

8. The pulse light source according to claim 7, further comprising:
  a third optical amplifier provided on an optical path between the first optical amplifier and the output end; and
  a second optical filter which suppresses an ASE component, the second optical filter being provided on an optical path between the first optical amplifier and the third optical amplifier.

9. The pulse light source according to claim 8, wherein a full width at half maximum of a transmission spectrum of the second optical filter is equal to or wider than a full width at half maximum of a transmission spectrum of the first optical filter.

10. The pulse light source according to claim 9, wherein the full width at half maximum of the transmission spectrum of the second optical filter is 1.5 or less times of the full width at half maximum of the transmission spectrum of the first optical filter.

11. The pulse light source according to claim 8, wherein a center wavelength of a transmission spectrum of the second optical filter is closer to a peak wavelength of the pulse light than a center wavelength of a transmission spectrum of the first optical filter.

12. The pulse light source according to claim 1, wherein the first optical filter is provided on an optical path between the first optical amplifier and the output end.

13. The pulse light source according to claim 12, further comprising:
 a second optical amplifier provided on an optical path between the first optical filter and the output end.

14. The pulse light source according to claim 13, further comprising:
 a third optical amplifier provided on an optical path between the second optical amplifier and the output end;
 a second optical filter which suppresses an ASE component, the second optical filter being provided on an optical path between the second optical amplifier and the third optical amplifier.

15. The pulse light source according to claim 14, wherein a full width at half maximum of a transmission spectrum of the second optical filter is equal to or wider than a full width at half maximum of a transmission spectrum of the first optical filter.

16. The pulse light source according to claim 15, wherein the full width at half maximum of the transmission spectrum of the second optical filter is 1.5 or less times of the full width at half maximum of the transmission spectrum of the first optical filter.

17. The pulse light source according to claim 14, wherein a center wavelength of a transmission spectrum of the second optical filter is closer to a peak wavelength of the pulse light than a center wavelength of a transmission spectrum of the first optical filter.

18. A pulse compression method, comprising the steps of:
 preparing the pulse light source as defined in claim 1;
 selectively outputting the chirping component of the pulse light from the first optical filter, by adjusting a relative position of a transmission spectrum of the first optical filter with respect to an output spectrum of the semiconductor laser.

* * * * *